(12) United States Patent
Fazan et al.

(10) Patent No.: US 7,061,050 B2
(45) Date of Patent: Jun. 13, 2006

(54) SEMICONDUCTOR DEVICE UTILIZING BOTH FULLY AND PARTIALLY DEPLETED DEVICES

(75) Inventors: Pierre Fazan, Morges (CH); Serguei Okhonin, Lausanne (CH)

(73) Assignee: Innovative Silicon S.A., Lausanne (CH)

( * ) Notice: Subject to any disclaimer, the term of this patent is extended or adjusted under 35 U.S.C. 154(b) by 258 days.

(21) Appl. No.: 10/487,157

(22) PCT Filed: Mar. 17, 2003

(86) PCT No.: PCT/EP03/02748

§ 371 (c)(1),
(2), (4) Date: Feb. 18, 2004

(87) PCT Pub. No.: WO03/088322

PCT Pub. Date: Oct. 23, 2003

(65) Prior Publication Data

US 2004/0238890 A1     Dec. 2, 2004

(30) Foreign Application Priority Data

Apr. 18, 2002  (EP) ................................ 02405316
Aug. 27, 2002  (EP) ................................ 02078585

(51) Int. Cl.
    H01L 27/01     (2006.01)
    H01L 27/12     (2006.01)
    H01L 31/0392   (2006.01)
(52) U.S. Cl. .................... 257/348; 257/68; 257/69; 257/71; 257/347; 438/149; 438/239
(58) Field of Classification Search .............. 257/62, 257/68–71, 288, 296, 347, 348, 350, 365, 257/638; 438/149, 239, 244, 250, 253
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,298,962 A | 11/1981 | Hamano et al. | |

(Continued)

FOREIGN PATENT DOCUMENTS

EP     0 030 856     6/1981

(Continued)

OTHER PUBLICATIONS

"A Capacitorless Double-Gate DRAM Cell", Kuo et al., IEEE Electron Device Letters, vol. 23, No. 6, Jun. 2002, pp. 345-347.

(Continued)

Primary Examiner—Amir Zarabian
Assistant Examiner—Khanh Duong
(74) Attorney, Agent, or Firm—Neil A. Steinberg

(57) ABSTRACT

A semiconductor device such as a DPAM memory device is disclosed. A, Substrate (12) of semiconductor material is provided with energy band modifying means in the form of a box region (38) and is covered by an insulating layer (14). A semi-conductor layer (16) has source (18) and drain (20) regions formed therein to define bodies (22) of respective field effect transistors. The box region (38) is more heavily doped than the adjacent body (22), but less highly doped than the corresponding source (18) and drain (20), and modifies the valence and/or conduction band of the body (22) to increase the amount of electrical charge which can be stored in the body (22).

20 Claims, 5 Drawing Sheets

U.S. PATENT DOCUMENTS

| | | |
|---|---|---|
| 4,791,610 A | 12/1988 | Takemae |
| 4,979,014 A | 12/1990 | Hieda et al. |
| 5,144,390 A | 9/1992 | Matloubian |
| 5,164,805 A | 11/1992 | Lee |
| 5,258,635 A | 11/1993 | Nitayama et al. |
| 5,388,068 A | 2/1995 | Ghoshal et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,528,062 A | 6/1996 | Hsieh et al. |
| 5,568,356 A | 10/1996 | Schwartz |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,696,718 A | 12/1997 | Hartmann |
| 5,740,099 A | 4/1998 | Tanigawa |
| 5,778,243 A | 7/1998 | Aipperspach et al. |
| 5,780,906 A | 7/1998 | Wu et al. |
| 5,784,311 A | 7/1998 | Assaderaghi et al. |
| 5,811,283 A | 9/1998 | Sun |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 6,018,172 A | 1/2000 | Hidaka et al. |
| 6,081,443 A | 6/2000 | Morishita |
| 6,096,598 A | 8/2000 | Furukawa et al. |
| 6,097,056 A | 8/2000 | Hsu et al. |
| 6,111,778 A | 8/2000 | MacDonald et al. |
| 6,121,077 A | 9/2000 | Hu et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,708 B1 | 1/2001 | Kuang et al. |
| 6,214,694 B1 | 4/2001 | Leobandung et al. |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,350,653 B1 | 2/2002 | Adkisson et al. |
| 6,351,426 B1 | 2/2002 | Ohsawa |
| 6,384,445 B1 | 5/2002 | Hidaka et al. |
| 6,391,658 B1 | 5/2002 | Gates et al. |
| 6,403,435 B1 | 6/2002 | Kang et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B1 | 10/2002 | Fujita et al. |
| 6,479,862 B1 | 11/2002 | King et al. |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,538,916 B1 | 3/2003 | Ohsawa |
| 6,544,837 B1 | 4/2003 | Divakaruni et al. |
| 6,548,848 B1 | 4/2003 | Horiguchi et al. |
| 6,549,450 B1 | 4/2003 | Hsu et al. |
| 6,552,398 B1 | 4/2003 | Hsu et al. |
| 6,556,477 B1 | 4/2003 | Hsu et al. |
| 6,566,177 B1 | 5/2003 | Radens et al. |
| 6,567,330 B1 | 5/2003 | Fujita et al. |
| 6,590,258 B1 | 7/2003 | Divakauni et al. |
| 6,590,259 B1 | 7/2003 | Adkisson et al. |
| 6,617,651 B1 | 9/2003 | Ohsawa |
| 6,621,725 B1 | 9/2003 | Ohsawa |
| 6,632,723 B1 | 10/2003 | Watanabe et al. |
| 6,650,565 B1 | 11/2003 | Ohsawa |
| 6,661,042 B1 | 12/2003 | Hsu |
| 6,714,436 B1 | 3/2004 | Burnett et al. |
| 6,724,046 B1 * | 4/2004 | Oyamatsu ................ 257/347 |
| 6,771,546 B1 | 8/2004 | Ikehashi et al. |
| 6,818,496 B1 * | 11/2004 | Dennison et al. ........... 438/239 |
| 6,861,689 B1 | 3/2005 | Burnett |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146488 A1 | 8/2003 | Nagano et al. |
| 2003/0151112 A1 | 8/2003 | Yamada et al. |
| 2003/0168677 A1 | 9/2003 | Hsu |
| 2003/0213994 A1 | 11/2003 | Hayashi et al. |
| 2004/0041206 A1 | 3/2004 | Bhattacharyya |
| 2004/0041208 A1 | 3/2004 | Bhattacharyya |
| 2004/0042268 A1 | 3/2004 | Bhattacharyya |
| 2004/0108532 A1 | 6/2004 | Forbes |

FOREIGN PATENT DOCUMENTS

| | | |
|---|---|---|
| EP | 0 350 057 B1 | 1/1990 |
| EP | 0 354 348 A2 | 2/1990 |
| EP | 0 202 515 B1 | 3/1991 |
| EP | 0 207 619 B1 | 8/1991 |
| EP | 0 175 378 B1 | 11/1991 |
| EP | 0 253 631 B1 | 4/1992 |
| EP | 0 513 923 | 11/1992 |
| EP | 0 300 157 B1 | 5/1993 |
| EP | 0 564 204 A2 | 10/1993 |
| EP | 0 579 566 A2 | 1/1994 |
| EP | 0 362 961 | 2/1994 |
| EP | 0 599 506 A1 | 6/1994 |
| EP | 0 359 551 B1 | 12/1994 |
| EP | 0 366 882 B1 | 5/1995 |
| EP | 0 465 961 B1 | 8/1995 |
| EP | 0 694 977 | 1/1996 |

| | | |
|---|---|---|
| EP | 0 333 426 B1 | 7/1996 |
| EP | 0 727 820 A1 | 8/1996 |
| EP | 0 739 097 A2 | 10/1996 |
| EP | 0 245 515 B1 | 4/1997 |
| EP | 0 788 165 A2 | 8/1997 |
| EP | 0 801 427 | 10/1997 |
| EP | 0 510 607 B1 | 2/1998 |
| EP | 0 537 677 B1 | 8/1998 |
| EP | 0 858 109 A2 | 8/1998 |
| EP | 0 860 878 A2 | 8/1998 |
| EP | 0 869 511 A2 | 10/1998 |
| EP | 0 878 804 | 11/1998 |
| EP | 0 920 059 A2 | 6/1999 |
| EP | 0 924 766 A2 | 6/1999 |
| EP | 0 642 173 B1 | 7/1999 |
| EP | 0 727 822 B1 | 8/1999 |
| EP | 0 933 820 A1 | 8/1999 |
| EP | 0 951 072 A1 | 10/1999 |
| EP | 0 971 360 A1 | 1/2000 |
| EP | 0 980 101 A2 | 2/2000 |
| EP | 0 601 590 B1 | 4/2000 |
| EP | 0 993 037 A2 | 4/2000 |
| EP | 0 836 194 B1 | 5/2000 |
| EP | 0 599 388 B1 | 8/2000 |
| EP | 0 689 252 B1 | 8/2000 |
| EP | 0 606 758 B1 | 9/2000 |
| EP | 0 682 370 B1 | 9/2000 |
| EP | 1 073 121 A2 | 1/2001 |
| EP | 0 726 601 B1 | 9/2001 |
| EP | 0 731 972 | 11/2001 |
| EP | 1 162 663 A2 | 12/2001 |
| EP | 1 162 744 A1 | 12/2001 |
| EP | 1 179 850 A2 | 2/2002 |
| EP | 1 180 799 | 2/2002 |
| EP | 1 191 596 A2 | 3/2002 |
| EP | 1 204 146 A1 | 5/2002 |
| EP | 1 204 147 A1 | 5/2002 |
| EP | 1 209 747 A2 | 5/2002 |
| EP | 0 744 772 B1 | 8/2002 |
| EP | 1 233 454 A2 | 8/2002 |
| EP | 0 725 402 B1 | 9/2002 |
| EP | 1 237 193 | 9/2002 |
| EP | 1 241 708 A2 | 9/2002 |
| EP | 1 253 634 A2 | 10/2002 |
| EP | 0 844 671 B1 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | 62-272561 | 11/1987 |
| JP | 02-294076 | 2/1991 |
| JP | 3-171768 | 7/1991 |
| JP | 8-213624 | 8/1996 |
| JP | 8-274277 | 10/1996 |
| JP | 9-046688 | 2/1997 |
| JP | 9-82912 | 3/1997 |
| JP | 10-242470 | 9/1998 |
| JP | 11-87649 | 3/1999 |
| JP | 2000-247735 | 8/2000 |
| JP | 2000-274221 | 9/2000 |
| JP | 2000-389106 | 12/2000 |
| JP | 2001-180633 | 6/2001 |
| JP | 2002-009081 | 1/2002 |
| JP | 2002-94027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |

OTHER PUBLICATIONS

"A Capacitorless Double-Gate DRAM Cell for High Density Applications", Kuo et al., IEEE IEDM, 2002, pp. 843-946.

"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.

"The Multistable Charge-Controlled Memory Effect in SOI MOS Transistors at Low Temperatures", Tack et al., IEEE Transactions on Electron Devices, vol. 37, No. 5, May 1990, pp. 1373-1382.

"Mechanisuns of Charge Modulation in the Floating Body of Triple-Well nMOSFET Capacitor-less DRAMs", Villaret et al., Proceedings of the INFOS 2003, Insulating Films on Semiconductors, 13th Bi-annual Conference, Jun. 18-20, 2003, Barcelona (Spain), (4 pages).

"A Memory Using One-Transistor Gain Cell on SOI (FBC) with Performance Suitable for Embedded DRAM's", Ohsawa et al., 2003 Symposium on VLSI Circuits Digest of Technical Papers, Jun. 2003 (4 pages).

FBC (Floating Body Cell) for Embedded DRAM on SOI, Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One-Transistor Gain Cell on SOI", Ohsawa et al., IEEE Journal of Solid-State Circuits, vol. 37, No. 11, Nov. 2002, pp. 1510-1522.

"Opposite Side Floating Gate SOI FLASH Memory Cell", Lin et al., IEEE, Mar. 2000, pp. 12-15.

"Advanced TFT SRAM Cell Technology Using a Phase-Shift Lithography", Yamanaka et al., IEEE Transactions on Electron Devices, vol. 42, No. 7, Jul. 1995, pp. 1305-1313.

"Soft-Error Characteristics in Bipolar Memory Cells with Small Critical Charge", Idei et al., IEEE Transactions on Electron Devices, vol. 38, No. 11, Nov. 1991, pp. 2465-2471.

"An SOI 4 Transistors Self-Refresh Ultra-Low-Voltage Memory Cell", Thomas et al., IEEE, Mar. 2003, pp. 401-404.

"Design of a SOI Memory Cell", Stanojevic et al., IEEE Proc. 21st International Conference on Microelectronics (MIEL '97), vol. 1, NIS, Yugoslavis, Sep. 14-17, 1997, pp. 297-300.

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"MOSFET Design Simplifies DRAM", P. Fazan, EE Times, May 14, 2002 (3 pages).

"One of Application of SOI Memory Cell—Memory Array", Lončar et al., IEEE Proc. 22nd International Conference on Microelectronics (MIEL 2000), vol. 2, NIŠ, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15 µm SOI DRAM", Terauchi et al., Proceedings 1996 IEEE International SOI Conference, Oct. 1996, pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei, IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"High-Performance Embedded SOI DRAM Architecture for the Low-Power Supply", Yamauchi et al., IEEE Journal of Solid-State Circuits, vol. 35, No. 8, Aug. 2000, pp. 1169-1178.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Hot-Carrier Effects in Thin-Film Fully Depleted SOI MOSFET's", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22.

"SOI MOSFET on Low Cost SPIMOX Substrate", Iyer et al., IEEE IEDM, Sep. 1998, pp. 1001-1004.

"Simulation of Floating Body Effect in SOI Circuits Using BSIM3SOI", Tu et al., Proceedings of Technical Papers (IEEE Cat No. 97$^{TH}$8303), pp. 339-342.

"High-Field Transport of Inversion-Layer Electrons and Holes Including Velocity Overshoot", Assaderaghi et al., IEEE Transactions on Electron Devices, vol. 44, No. 4, Apr. 1997, pp. 664-671.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.

"Hot-Carrier-Induced Degradation in Ultra-Thin-Film Fully-Depleted SOI MOSFETs", Yu et al., Solid-State Electronics, vol. 39, No. 12, 1996, pp. 1791-1794.

Hot-Carrier Effect in Ultra-Thin-Film (UTF) Fully-Depleted SOI MOSFET's, Yu et al., 54$^{th}$ Annual Device Research Conference Digest (Cat. No. 96$^{TH}$8193), pp. 22-23.

"SOI MOSFET Design for All-Dimensional Scaling with Short Channel, Narrow Width and Ultra-thin Films", Chan et al., IEEE IEDM, 1995, pp. 631-634.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE Electron Device Letters, vol. 15, No. 12, Dec. 1994, pp. 510-512.

"Dynamic Threshold-Voltage MOSFET (DTMOS) for Ultra-Low Voltage Operation", Assaderaghi et al., 1994 EEE, IEDM 94, pp. 809-812.

"A Capacitorless DRAM Cell on SOI Substrate", Wann et al., IEEE IEDM 1993, pp. 635-638.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si-SiO$_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure in SOI MOS Devices", Tack et al., Solid-State Electronics vol. 33, No. 3, 1990, pp. 357-364.

"A Long Data Retention SOI DRAM with the Body Refresh Function", Tomishima et al., IEICE Trans. Electron., vol. E80-C, No. 7, Jul. 1997, pp. 899-904.

"Capacitor-Less 1-Transistor DRAM", Fazan et al., 2002 IEEE International SOI Conference, Oct. 2002, pp. 10-13.

"SOI (Silicon-on-Insulator) for High Speed Ultra Large Scale Integration", C. Hu, Jpn. J. Appl. Phys. vol. 33 (1994) pp. 365-369, Part 1, No. 1B, Jan. 1994.

"Source-Bias Dependent Charge Accumulation in P+ -Poly Gate SOI Dynamic Random Access Memory Cell Transistors", Sim et al., Jpn. J. Appl. Phys. vol. 37 (1998) pp. 1260-1263, Part 1, No. 3B, Mar. 1998.

"Suppression of Parasitic Bipolar Action in Ultra-Thin-Film Fully-Depleted CMOS/SIMOX Devices by Ar-Ion Implantation into Source/Drain Regions", Ohno et al., IEEE Transactions on Electron Devices, vol. 45, No. 5, May 1998, pp. 1071-1076.

"Fully Isolated Lateral Bipolar-MOS Transistors Fabricated in Zone-Melting-Recrystallized Si Films on SiO$_2$.", Tsaur et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's in Small-Grain LPCVD Polycrystalline Silicon", Malhi et al., IEEE Transactions on Electron Devices, vol. ED-32, No. 2, Feb. 1985, pp. 258-281.

"Triple-Wel nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).

"Mechanisms of Charge Modulation in the Floating Body of Triple-Well NMOSFET Capacitor-less DRAMs", Villaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"DRAM Design Using the Taper-Isolated Dynamic RAM Cell, Leiss et al.", IEEE Transactions on Electron Devices, vol. ED-29, No. 4, Apr. 1982, pp. 707-714.

* cited by examiner

100# SEMICONDUCTOR DEVICE UTILIZING BOTH FULLY AND PARTIALLY DEPLETED DEVICES

The present invention relates to semiconductor devices, and relates particularly, but not exclusively, to semiconductor charge storage devices such as semiconductor memories, and to substrates for manufacturing such devices.

International patent application PCT/EP02/06495 discloses a DRAM (Dynamic Random Access Memory) device comprising a matrix of memory cells, each cell being formed by a field effect transistor. By applying suitable voltage pulses between the gate and drain and between the source and drain of each transistor, an electric charge can be generated and stored in the body of the transistor, the presence or absence of the charge representing a "1" or "0" state of a binary data bit. Memory devices using SOI (Silicon On Insulator) type field effect transistors are disclosed in more detail in "SOI technology: materials to VLSI", second edition, Kluwer, Boston 1997.

The transistors used in this type of device are PD-SOI (partially depleted silicon on insulator) transistors, which are formed in a layer of silicon formed on an insulating layer, the source, body and drain of each transistor being formed in the same layer, throughout the whole thickness of the silicon layer. The silicon layer is then covered by a dielectric film on which the gate of each transistor is formed.

To enable a charge to be stored in the body of a transistor of this type, it is necessary for the body of the transistor to have a sufficiently thick layer of silicon at its central part to provide the silicon with a non-depleted region, known as the neutral region, the charge being stored in, or in the proximity of, this latter region. As a consequence, such transistors are known as partially depleted transistors.

FD-SOI (fully depleted silicon on insulator) transistors are known, in which the silicon layer in which the source and drain regions are formed is thinner and/or the doping is less concentrated than in the case of partially depleted SOI transistors, as a result of which no neutral zone is provided. This means that it is not possible to store a charge in the body of such transistors. However, FD-SOI transistors present a number of advantages compared with partially depleted transistors, for example excellent short channel behaviour and a very rapid switching frequency. These advantages result from the small thickness of the silicon layer.

A comparison of the construction of bulk and SOI transistors is shown in FIGS. 1 and 2. Referring to FIGS. 1a and 2a, an SOI transistor is formed from a substrate 10 having a substrate layer 12 of silicon, an insulating layer 14 of silicon oxide or sapphire, and a silicon layer 16. In the case of a transistor using bulk technology, as shown in FIGS. 1b and 2b, the substrate 10 comprises only the silicon substrate layer 12.

Referring to FIGS. 2a and 2b, in which parts common to both types of device are denoted by like reference numerals, integrated circuits comprising field effect transistors (of which only one is shown in each of FIGS. 2a and 2b) are formed on the substrates 10 by successive photolithographic operations in which layers are partially removed, doped or new layers are deposited. The field effect transistor shown in FIG. 2a has a source 18 and a drain 20 formed in layer 16, a body 22 being defined between the source 16 and drain 20, the source 18 and drain 20 extending through the full depth of layer 16. As will be familiar to persons skilled in the art, the source 18, drain 20 and body 22 are formed by doping of the silicon of layer 16. The body 22 is covered by a dielectric film 24 overlapping with source 18 and drain 20, and on which a gate 26 is provided. The layer 25 is removed around the source 18 and drain 20, and replaced by an insulating framework 28 of silicon oxide. When a suitable voltage is applied to the gate 26, an electrically conducting channel 30 connecting the source 18 and drain 20 forms at the surface of the body 22 at the interface with dielectric film 24.

Referring to FIG. 2b, the source 18 and drain 20 are formed in substrate layer 12 to define the body 22 between the source and the drain, and the dielectric film 24 covers the body 22 and overlaps the source 18 and drain 20.

Referring now to FIGS. 3a and 3b, FIG. 3b shows the variation of potential with thickness z (measured from the interface with dielectric film 24) of region B in the bulk transistor of FIG. 3a. The graph shown in FIG. 3b shows curves $B_c$, $B_v$ and $N_f$, representing the potential of the valence band, the conduction band and the Fermi level respectively at the interior of body 22. Similarly, FIGS. 4a and 4b show corresponding diagrams for a PD-SOI transistor, and FIGS. 5a and 5b show corresponding diagrams for a FD-SOI transistor.

It can be seen from FIGS. 3b to 5b that the valence band $B_v$ and conduction band $B_c$ have a minimum value of potential at the interface of body 22 and dielectric film 24 in the case of each type or transistor. However, it can be seen from FIG. 3b that the potentials $B_v$ and $B_c$ vary in a first zone $Z_d$, and tend towards a limiting value beyond which a second zone $Z_n$, known as the neutral zone, starts. This second zone $Z_n$ extends through the total thickness of the substrate layer 12. When a suitable voltage is applied to gate 26, an electrically conducting channel 30 forms at the surface of the body 22 at the interface with dielectric film 24.

Referring now to FIG. 4b, it can be seen that the PD-SOI transistor has two depletion zones $Z_{d1}$ and $Z_{d2}$, adjacent dielectric film 24 and insulting layer 14 respectively, between which is located a neutral zone $Z_n$. It will be appreciated by persons skilled in the art that the shape and extent of depletion zone $Z_{d2}$ depends upon the back gate potential relative to the front gate potential. It is possible to store an electric charge in the body 22, in particular in, or in the proximity of, neutral zone $Z_n$ located between the two depletion zones $Z_{d1}$ and $Z_{d2}$. One possible application of such a transistor is as an individual memory cell, capable of representing two logic states depending upon the presence or absence of charge in or in the proximity of the neutral zone $Z_n$, for forming a semiconductor memory device such as a DRAM.

Referring now to FIG. 5b, it can be seen that in the case of the FD-SOI transistor, the potential of the conduction band $B_c$ and valence band $B_v$ varies continually throughout the entire thickness of body 22. In other words, the body 22 has a depletion zone $Z_d$ extending throughout its entire thickness, as a result of which no neutral zone exists. It is therefore not possible to store charge in the body 22, and the transistor of this type therefore cannot be used as a memory cell. However, transistors of this type have a number of advantages, in particular excellent short channel behaviour and a very rapid switching frequency, these properties being as a result of the small thickness of layer 16.

Preferred embodiments of the present invention seek to combine the advantageous features of partially and fully depleted SOI transistors.

According to an aspect of the present invention, there is provided a semiconductor device comprising:
- a substrate of semiconductor material;
- a first electrically insulating layer provided on said substrate;
- a first semiconductor layer provided on said first insulating layer and adapted to have respective source and drain regions of at least one field effect transistor formed therein to define a respective body region between said source and drain regions; and
- energy band modifying means for modifying the valence and/or conduction band in a said body region of at least one said field effect transistor to increase the amount of electrical charge which can be at least temporarily stored in said body region.

By providing energy band modifying means for modifying the valence and/or conduction band of the body region of at least one said field effect transistor to increase the amount of electrical charge which can be stored in said body region, this provides the surprising advantage that the first semiconductor layer can be made considerably thinner than in the case of the prior art, which means that the advantages due to the thin layers of FD-SOI transistors (e.g. faster device performance) can be combined with the charge storing capability of PD-SOI transistors. For example, the present invention can be used to construct a particularly compact semiconductor memory device in which individual bits of data are represented by the presence or absence of charge stored in the body of individual transistors, while also utilising transistors of high performance.

The energy band modifying means may be adapted to create a region in which an electrical charge can be at least temporarily stored in the body region or at least one said field effect transistor.

In a preferred embodiment, the energy band modifying means is adapted to increase the length, in a direction substantially perpendicular to said first insulating layer, of a region in which the energy of said valence and conduction band in the body region of at least one said field effect transistor is substantially constant.

The energy band modifying means may be adapted to apply a respective voltage change to a respective source, drain and at least one gate of at least one said field effect transistor.

By applying voltage shifts to the source, drain and at least one gate of at least one said field effect transistor, this enables the charge storing capability of the invention to be achieved without significantly altering the substrate potential. This significantly improves the versatility of integrated devices formed from the device, for example by providing the advantage that charge storing memory devices can be located on the same substrate as logic devices, which latter devices generally cannot function if significant voltage shifts are applied to the substrate, and the voltage shifts applied to the memory devices only. The advantage is also provided that the device can be manufactured with the minimum number of manufacturing steps.

In a preferred embodiment, the energy band modifying means comprises a doped portion of the body region of at least one said field effect transistor, wherein said doped portion is more heavily doped than the adjacent portion of the corresponding said body region.

The doped portion may be arranged adjacent said first insulating layer.

The energy band modifying means may comprise at least one second semiconductor layer arranged adjacent source and drain regions of at least one said field effect transistor in use and on a side of said first insulating layer remote from said first semiconductor layer.

At least one said second semiconductor layer may at least partially cover said substrate.

At least one said second semiconductor layer preferably forms part of said substrate.

The device may further comprise contact means for connecting the or each said second semiconductor layer to a respective source of electrical input signals.

The device may further comprise respective source and drain regions of at least one said field effect transistor formed in said first semiconductor layer to define a respective body region between said source and drain regions.

The device may further comprise at least one respective gate or at least one said field effect transistor arranged adjacent the corresponding said body region of said field effect transistor.

The device may further comprise a second insulating layer formed on said first semiconductor layer, and at least one respective gate region of at least one said field effect transistor arranged on said second insulating layer.

In a preferred embodiment, the device is a semiconductor memory device.

According to another aspect of the present invention, there is provided a method of controlling a semiconductor device comprising a substrate of semiconductor material, a first electrically insulating layer provided on said substrate, and a first semiconductor layer provided on said first insulating layer and having respective source and drain regions of at least one field effect transistor formed therein to define a respective body region between said source and drain regions, the method comprising modifying the valence and/or conduction band in a respective body region of at least one said field effect transistor to increase the amount of electrical charge which can be at least temporarily stored in said body region.

The step of modifying said valence and/or conduction band may comprise applying a respective voltage change to a respective source, drain and at least one gate of said field effect transistor.

The step of modifying said valence and/or conduction band may comprise applying a respective voltage to at least one second semiconductor layer located on a side of said first insulating layer remote from said first semiconductor layer.

According to a further aspect of the present invention, there is provided a semiconductor wafer comprising:
- a substrate of doped semiconductor material;
- a first electrically insulating layer provided on said substrate;
- a first semiconductor layer provided on said first insulating; and
- at least one second layer of doped semiconductor material provided on a side of said first electrically insulating layer remote from said first semiconductor layer, wherein the or each said second semiconductor layer is more strongly doped than the respective region of said substrate adjacent thereto.

Preferred embodiments of the invention will now be described, by way of example only and not in any limitative sense, with reference to the accompanying drawings, in which:

FIG. 2a is a schematic cross-sectional view of a known transistor formed from the substrate of FIG. 1a;

FIG. 3a is a schematic cross-sectional view of the transistor of FIG. 2b showing a region in which variation in potential is considered;

FIG. 3b is a graph illustrating the variation in potential in region B of the transistor of FIG. 3a;

FIG. 4a is a schematic cross-sectional view of the transistor of FIG. 2a using PD-SOI technology;

FIG. 4b is a graph showing the variation of potential in region B of the transistor shown in FIG. 4a;

FIG. 5a is a schematic cross-sectional view of the transistor or FIG. 2a using FD-SOI technology;

FIG. 5b is a graph showing the variation of potential in the region B of the transistor of FIG. 5a;

Figure 6:
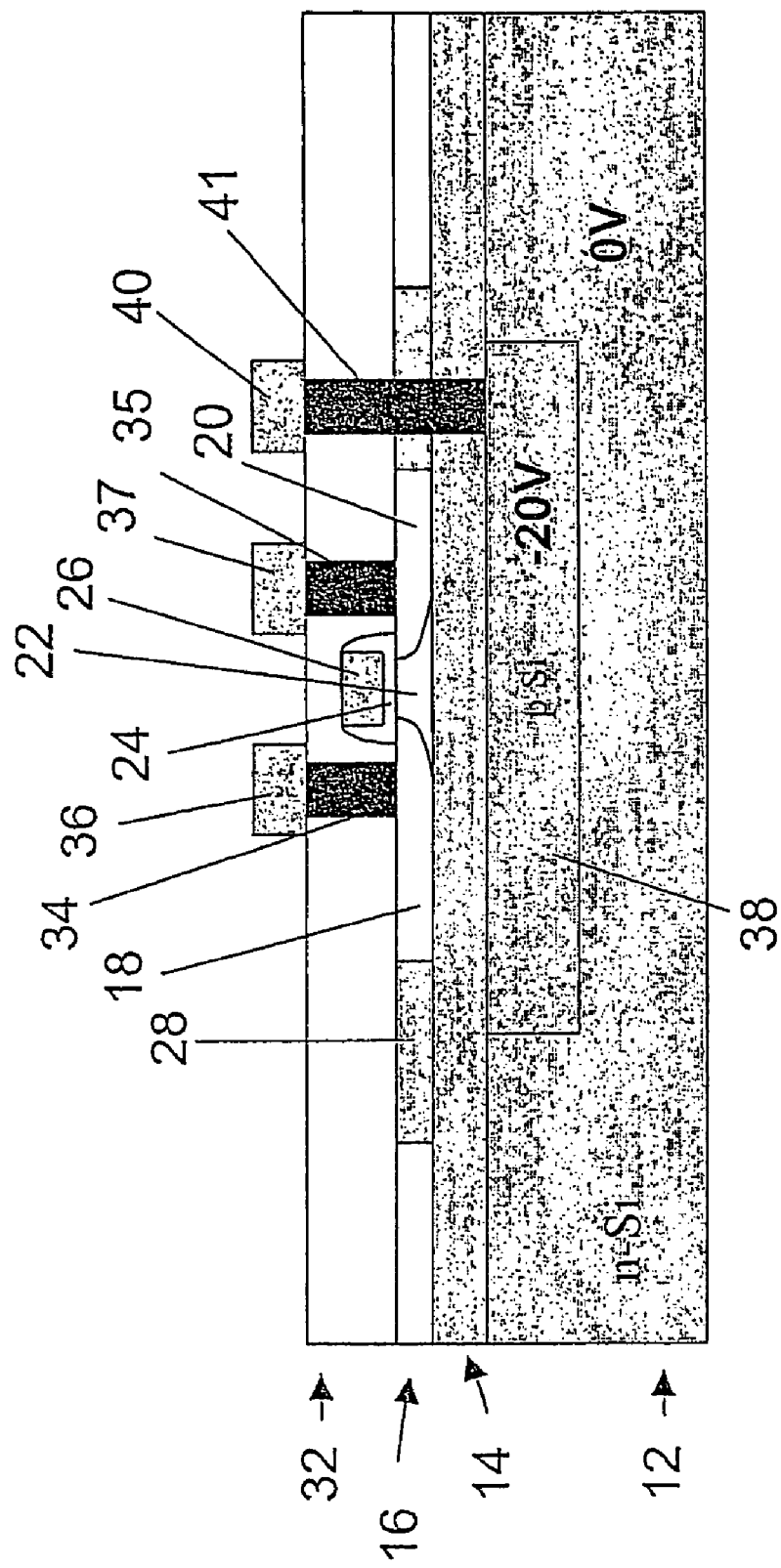
FIG. 6 is a schematic cross-sectional view of a semiconductor device of a first embodiment of the present invention.

Referring to FIG. 6, a semiconductor device embodying the present invention is shown in which parts common to the device of FIG. 5a are denoted by like reference numerals. A first semiconductor layer in the form of a silicon layer 16 in which an NMOS transistor is formed is covered by an insulating layer 32, perforated by windows which are filled with conductive material to form contact areas 34, 35 connected to the source 18 and drain 20 regions respectively. The contact areas 34, 35 are connected to conductive lines 36, 37 respectively.

The NMOS transistor of FIG. 6 has a substrate layer 12 of n-type silicon having a second semiconductor layer in the form of a box region 38 of p-type silicon which is highly doped compared with the body 22, but less highly doped than the corresponding source 18 and drain 20. The box region 38 is connected to a conductive line 40 by means of contact area 41 passing through insulating layer 14, framework 28 and insulating layer 32. An arrangement of transistors of this type can be made using 0.13 µm technology, having an insulating layer 14 of thickness 400 nm and silicon layer 16 of thickness 30 nm. It should be noted that a single contact 41 can be used for a plurality of transistors of this type, and would typically be used for tens or hundreds of transistors.

Figure 1A:
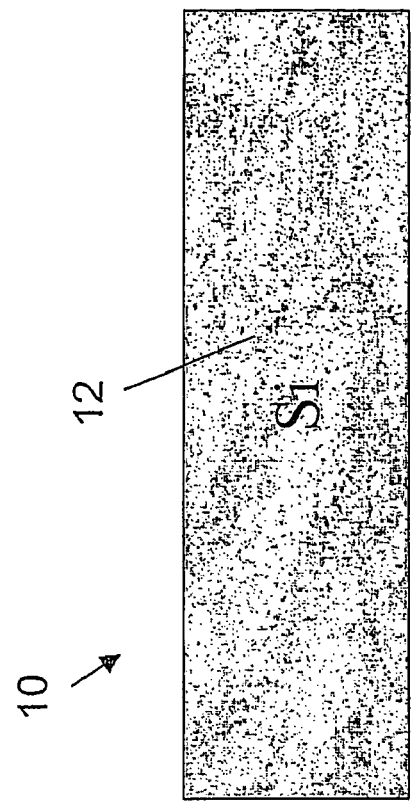
FIG. 1a shows a schematic cross-sectional view of a known substrate for fabrication of integrated circuits using SOI technology.
Figure 1B:
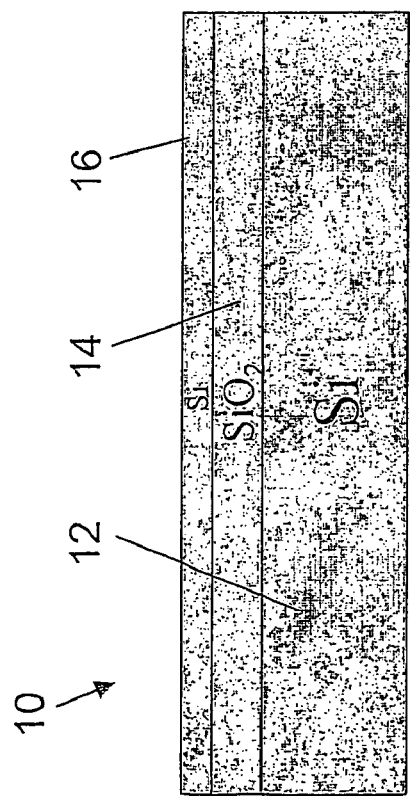
FIG. 1b is a schematic cross-sectional view of a known substrate for fabrication of integrated circuits using bulk technology.
Figure 2A:
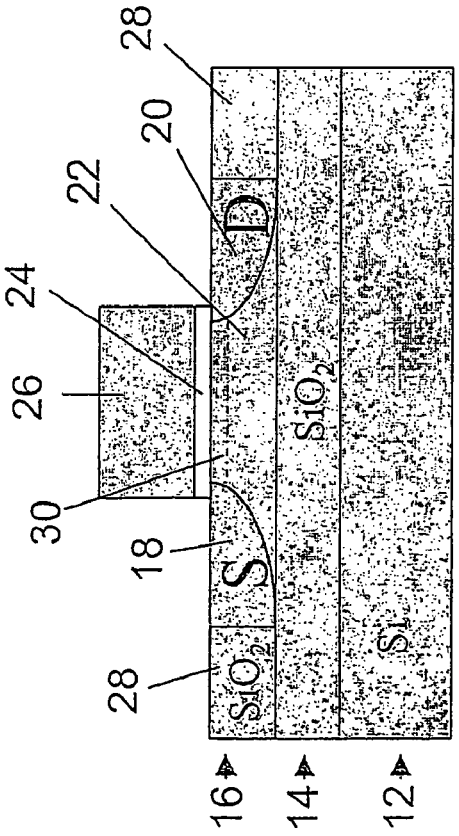
Figure 2B:
FIG. 2b is a cross-sectional view of a known transistor formed from the substrate of FIG. 1b.
Figures 3, 4, 5:
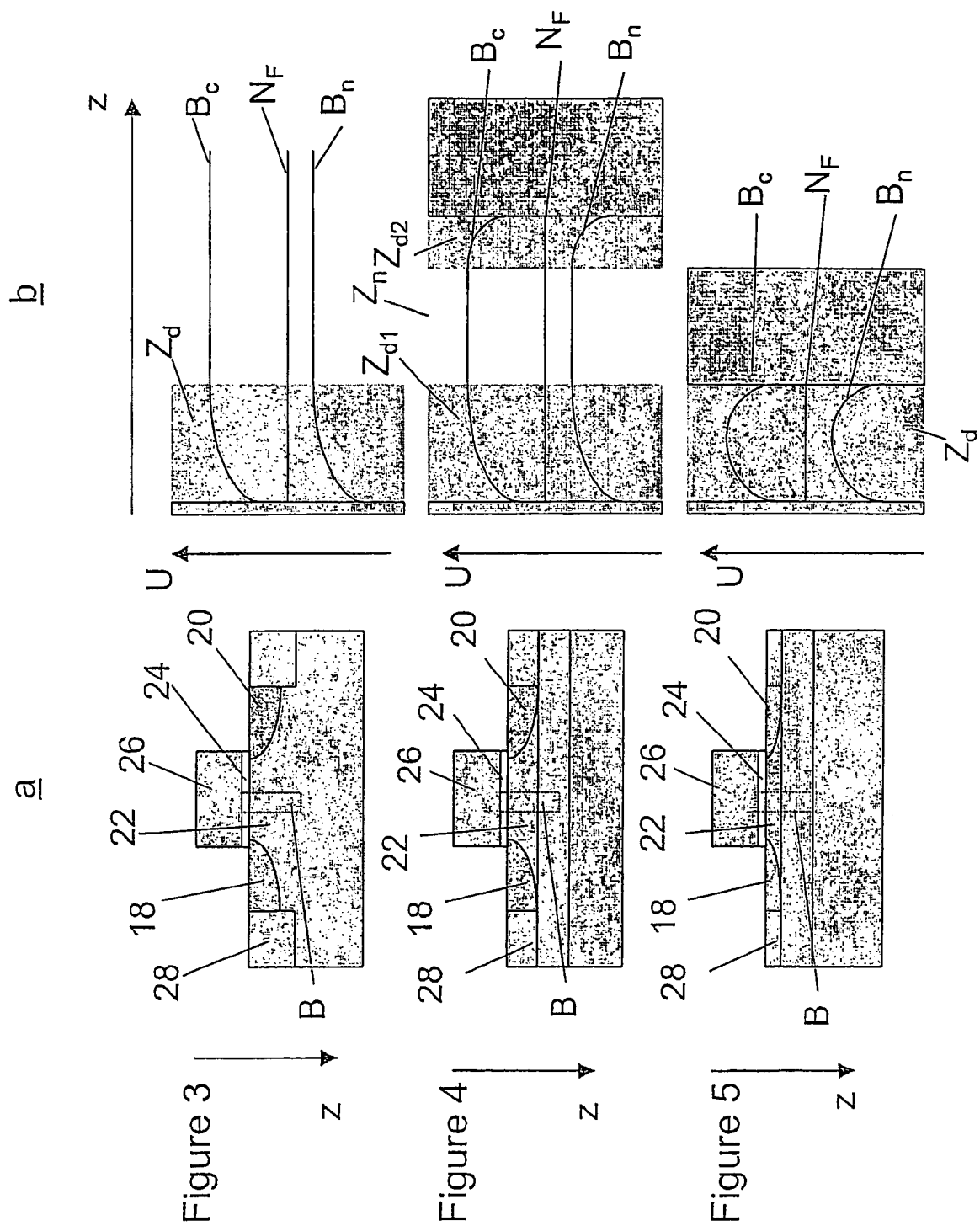

By applying a negative voltage to box region 38, typically in the region of −20V for a layer 14 of thickness 400 nm, it is possible by means of the potential difference between gate 26 and box region 38 to form a neutral zone in the body 22, similar to the neutral zone of the PD-SOI transistor of FIG. 4. In this way, it is possible to generate, store and eliminate an electric charge in this neutral zone, the voltage necessary to create the neutral zone being reduced if the thickness of the layer 14 is reduced. Accordingly, such a transistor can be used to store a charge representing binary data, for example in a semiconductor DRAM memory or embedded memory device. A process for generating or eliminating electric charge in such a transistor is described in International patent application PCT/GB02/06495. In the regions of the device not provided with a box region 38, it is possible to form conventional FD-SOI or PD-SOI transistors.

Figure 7A:
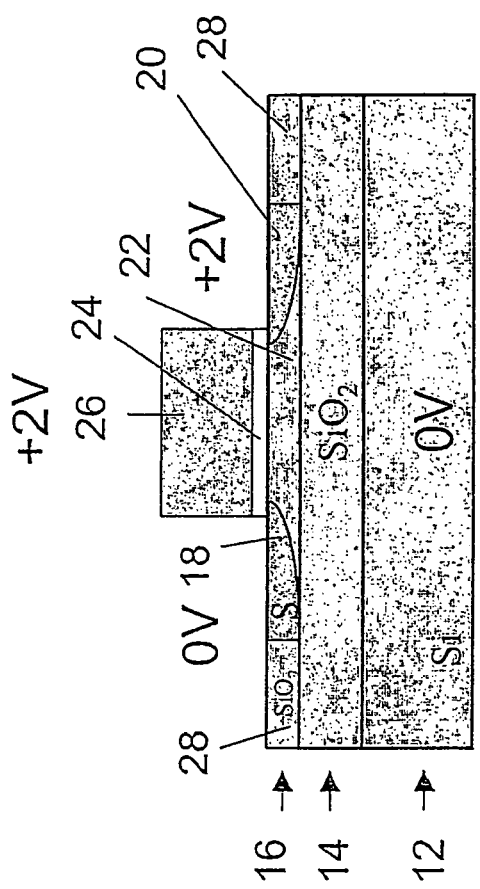
FIG. 7a is a schematic cross-sectional view of a semiconductor device of a second embodiment of the present invention, having unmodified energy bands.
Figure 7B:
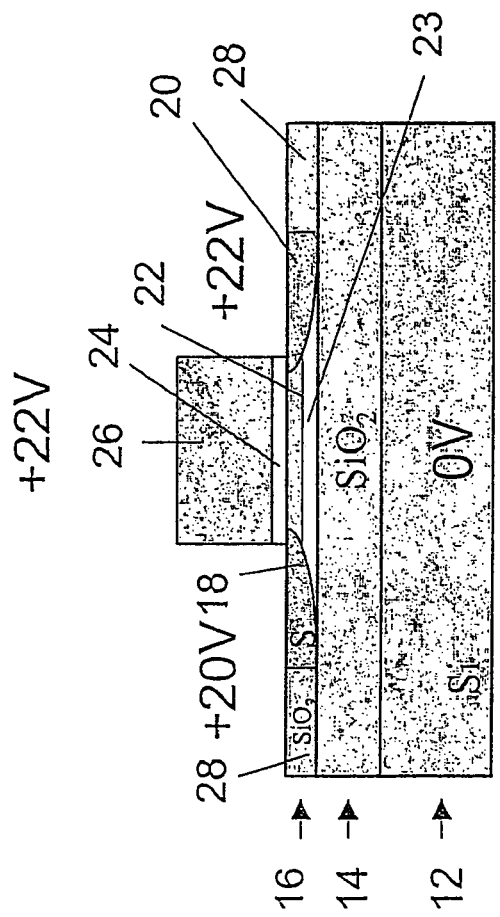
FIG. 7b is a schematic cross-sectional view of the device of FIG. 7a having modified energy bands.

Referring to FIGS. 7a and 7b, in which parts common to the embodiment of FIG. 6 are denoted by like reference numerals, as an alternative to providing box region 38 to distort the valence and/or conduction band in the body 22 to increase the amount of charge which can be stored in the body 22, it is possible to have a sufficiently large potential difference between the gate 26 and substrate layer 12 adjacent the body 22 to provide a charge storing neutral zone in the body 22. This is achieved, for example, by applying a relatively large voltage shift (i.e. in the region of +20V) to each of the gate 26, source 18 and drain 20 of the transistor.

In particular, as shown in FIGS. 7a and 7b, FIG. 7a illustrates a fully depleted (FD) SOI transistor biased in such a way as to behave like a normal FD device. In FIG. 7a, applying 2V on the gate 26 and 2V on the drain 20, while the source 18 is kept at 0V turns on the transistor. FIG. 7b, on the other hand, illustrates the same FD SOI transistor behaving electrically like a partially depleted (PD) device. The addition of 20V on all device nodes distorts the bands in such a way as to create a neutral region 23 in the transistor body 22. 20V is used when layer 14 is typically 400 nm thick. The respective voltage added is reduced proportionally in the case of a thinner layer 14.

The arrangement of FIG. 7b enables the charge storing neutral zone to be formed without the necessity of significantly altering the voltage of the substrate layer 12, and requires fewer manufacturing steps than are necessary for the device shown in FIG. 6. This also provides the advantage that memory and logic devices can be formed on the same substrate, since although memory devices generally function correctly if a significant voltage shift is applied to the substrate, this is generally not the case for logic devices such as processors. Accordingly, the voltage shifts are applied to the memory devices but not to the logic devices.

Figure 8:
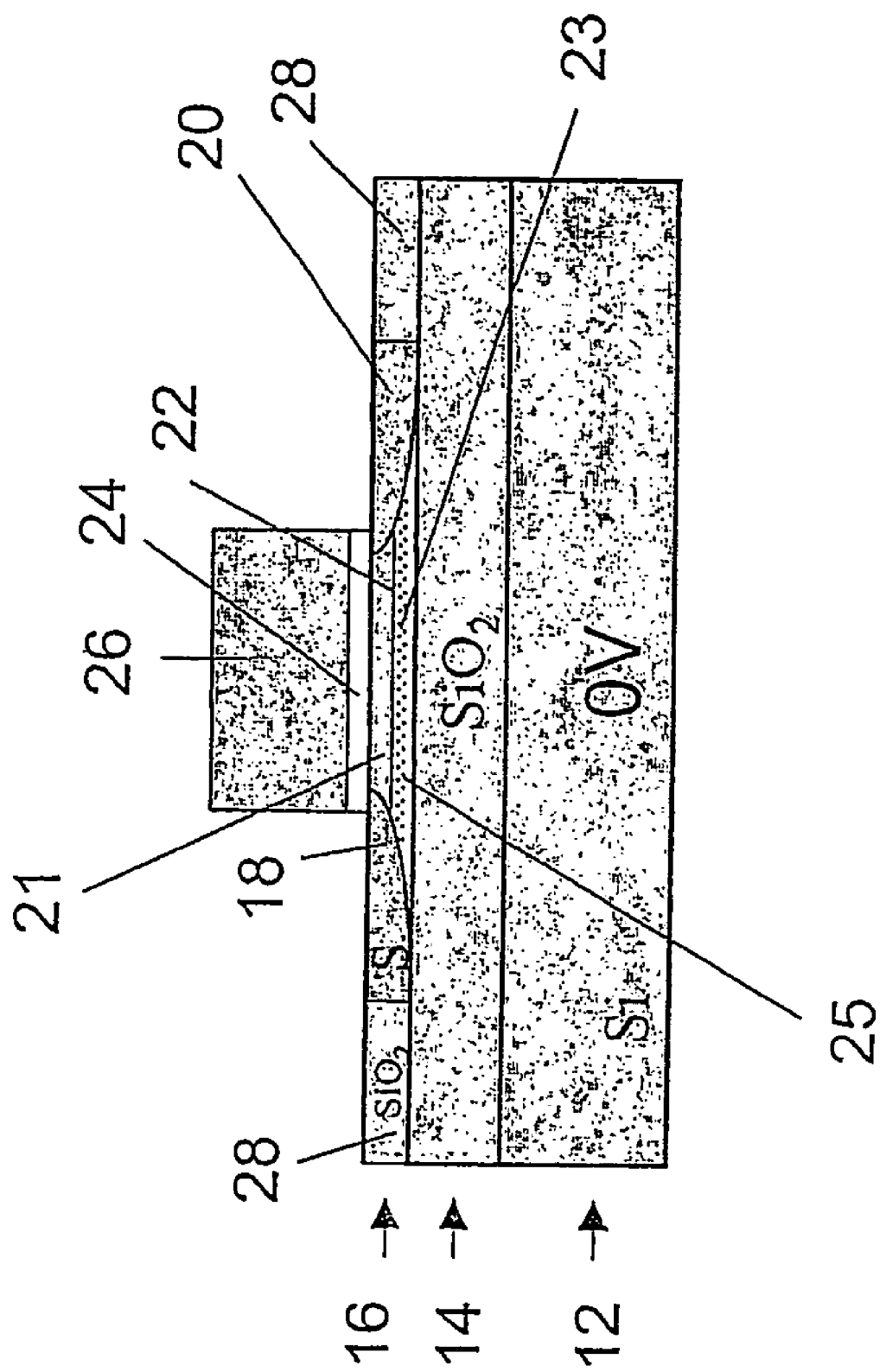
FIG. 8 is a schematic cross-sectional view of a semiconductor device of a third embodiment of the present invention.

Referring to FIG. 8, in which parts common to the embodiments of FIGS. 6 and 7 are denoted by like reference numerals, the box region 38 is replaced by a highly doped region at the lower part of body 22 adjacent the insulating layer 14, the source 18 and the drain 20. Such a layer causes a similar effect to operation of the box region 38 of FIG. 6. In particular, the energy bands of the body of the transistor are modified by doping more heavily a portion 25 of the body 22. This creates a doping gradient in the body. The body 22 has therefore an upper part 21 with low doping content and a lower part 25 with a high doping content. This can be achieved by proper ion implantation, by epitaxy or by diffusion. The higher doping level of the lower body part 25 distorts the bands in such a way as to create a region where the bands are flat, therefore creating a neutral region 23.

It can therefore be seen that the present invention allows transistors to be formed, the bodies of which can store an electric charge representing a binary data bit, in a silicon layer much narrower than in the prior art, with the advantage that the improved device performance of FD-SOI transistors is obtained.

It will be appreciated by persons skilled in the art that the above embodiment has been described by way of example only, and not in any limitative sense, and that various alterations and modifications are possible without departure from the scope of the invention as defined by the appended claims. Furthermore, it will be appreciated by persons skilled in the art that the above principle can be applied to PD-SOI type circuits when the thickness of the neutral zone is insufficient for the intended purpose or those circuits, and that the principle can be applied to PMOS type transistors as well as NMOS type transistors, in which case the polarities of the voltages used are opposite from those set out in the above-described embodiment.

The invention claimed is:

1. An integrated circuit device, disposed on or in a first semiconductor region or layer which resides on or above an insulating region or layer, wherein the insulating region or layer is disposed on or over a substrate, the integrated circuit device comprising:
   a memory portion including at least one semiconductor memory cell having at least one transistor to constitute the memory cell, the at least one transistor including:
      a source region disposed on or in the first semiconductor region;
      a drain region disposed on or in the first semiconductor region;
      a body region disposed on or in the first semiconductor region and between the source region, the drain region, and the insulating region or layer, wherein the body region is electrically floating;
      a gate disposed over the body region; and
   wherein the memory cell includes:
      a first data state representative of a first charge in the body region; and
      a second data state representative of a second charge in the body region;
   a non-memory portion including at least one transistor having:
      a source region disposed in or on the first semiconductor region;
      a drain region disposed in or on the first semiconductor region;
      a body region disposed in or on the first semiconductor region and between the source region, the drain region and the insulating region or layer;
      a gate disposed over the body region; and
   wherein the integrated circuit device further includes a second semiconductor region or layer disposed on or in the substrate and juxtaposed the body region of the at least one transistor of the at least one semiconductor memory cell of the memory portion and separated therefrom by the insulating region or layer, and wherein the second semiconductor region or layer is not disposed on or in a portion of the substrate juxtaposed the body region of the at least one transistor of the non-memory portion.

2. The integrated circuit device of claim 1 wherein the second semiconductor region or layer is connected to a voltage that provides a neutral zone in the body region of the at least one transistor of the at least one semiconductor memory cell of the memory portion.

3. The integrated circuit device of claim 2 wherein the voltage is a constant voltage.

4. The integrated circuit device of claim 1 wherein the second semiconductor region or layer is connected to a voltage that provides a neutral zone in the body region of the at least one transistor of the at least one semiconductor memory cell of the memory portion such that an electric charge may be generated in, stored in and/or eliminated from the neutral zone in the body region of the at least one transistor of the at least one semiconductor memory cell.

5. The integrated circuit device of claim 4 wherein the voltage is a constant or fixed voltage.

6. The integrated circuit device of claim 1 further including a contact area to connect a conductive line to the second semiconductor region or layer.

7. The integrated circuit device of claim 6 wherein the contact area connects the conductive line to the second semiconductor region or layer from above the substrate.

8. The integrated circuit device of claim 1 wherein the second semiconductor region or layer is a P-type silicon region or layer and the substrate is an N-type silicon substrate.

9. The integrated circuit device of claim 1 wherein the integrated circuit device is a DRAM memory device.

10. The integrated circuit device of claim 1 wherein an electric charge is capable of being stared in the body region of the at least one transistor of the at least one semiconductor memory cell in response to a voltage applied to the second semiconductor region or layer.

11. An integrated circuit device, disposed on or in a first semiconductor region or layer which resides on or above an insulating region or layer, wherein the insulating region or layer is disposed on or over a substrate, the integrated circuit device comprising:
   a memory portion including a plurality of semiconductor memory cells, each memory cell having at least one transistor to constitute the memory cell, the at least one transistor including:
      a source region disposed on or in the first semiconductor region;
      a drain region disposed on or in the first semiconductor region;
      a body region disposed on or in the first semiconductor region and between the source region, the drain region, and the insulating region or layer, wherein the body region is electrically floating;
      a gate disposed over the body region; and
   wherein the memory cell includes:
      a first data state representative of a first charge in the body region; and
      a second data state representative of a second charge in the body region;
   a non-memory portion including a plurality of transistors, each transistor including:
      a source region disposed in or on the first semiconductor region;
      a drain region disposed in or on the first semiconductor region;
      a body region disposed in or on the first semiconductor region and between the source region, the drain region, and the insulating region or layer;
      a gate disposed over the body region; and
   wherein the integrated circuit device further includes a second semiconductor region or layer disposed on or in the substrate and juxtaposed the body region of the at least one transistor of each semiconductor memory cell of the plurality of semiconductor memory cells of the memory portion and separated therefrom by the insulating region or layer, and wherein the second semiconductor region or layer is not disposed on or in a portion of the substrate juxtaposed the body region of each transistor of the plurality of transistors of the non-memory portion.

12. The integrated circuit device of claim 11 wherein the at least one transistor of each semiconductor memory cell of the plurality of semiconductor memory cells of the memory portion and a plurality of transistors of the non-memory portion are NMOS transistors.

13. The integrated circuit device of claim 11 wherein the second semiconductor region or layer is connected to a voltage that provides a neutral zone in the body region of the at least one transistor of each semiconductor memory cell of the plurality of semiconductor memory cells of the memory portion.

14. The integrated circuit device of claim 13 wherein the voltage is a constant or fixed voltage.

15. The integrated circuit device of claim 11 further including a contact area to connect a conductive line to the second semiconductor region or layer.

16. The integrated circuit device of claim 15 wherein the contact area connects the conductive line to the second semiconductor region or layer from above the substrate.

17. The integrated circuit device of claim 11 wherein the integrated circuit device is a DRAM memory device.

18. The integrated circuit device of claim 11 wherein an electric charge is capable of being stored in the body region of the at least one transistor of each semiconductor memory cell of the plurality of semiconductor memory cells in response to a voltage applied to the second semiconductor region or layer.

19. The integrated circuit device of claim 18 further including a contact area to connect a conductive line to the second semiconductor region or layer, wherein the contact area connects the conductive line to the second semiconductor region or layer from above the substrate.

20. The integrated circuit device of claim 19 wherein the voltage is a constant or fixed voltage.

* * * * *